| (12) | United States Patent | (10) Patent No.: | US 8,570,017 B2 |
|---|---|---|---|
| | Perichon et al. | (45) Date of Patent: | Oct. 29, 2013 |

(54) VOLTAGE LIMITER AND PROTECTION OF A PHOTOVOLTAIC MODULE

(75) Inventors: Pierre Perichon, Voiron (FR); Daniel Chatroux, Teche (FR)

(73) Assignee: Commissariat a l'Energie Atomique, Paris (FR)

( * ) Notice: Subject to any disclaimer, the term of this patent is extended or adjusted under 35 U.S.C. 154(b) by 559 days.

(21) Appl. No.: 12/528,054

(22) PCT Filed: Feb. 18, 2008

(86) PCT No.: PCT/EP2008/051947
§ 371 (c)(1),
(2), (4) Date: Mar. 2, 2010

(87) PCT Pub. No.: WO2008/101902
PCT Pub. Date: Aug. 28, 2008

(65) Prior Publication Data
US 2010/0164459 A1 Jul. 1, 2010

(30) Foreign Application Priority Data
Feb. 20, 2007 (FR) .................................. 07 53383

(51) Int. Cl.
*G05F 1/571* (2006.01)
(52) U.S. Cl.
USPC .......................... 323/284; 323/285; 323/906
(58) Field of Classification Search
USPC ................... 361/18, 86, 87, 91.1, 91.7, 93.1; 323/284, 285, 906
See application file for complete search history.

(56) References Cited

U.S. PATENT DOCUMENTS

| 4,736,267 | A | * | 4/1988 | Karlmann et al. | 361/101 |
|---|---|---|---|---|---|
| 4,937,697 | A | * | 6/1990 | Edwards et al. | 361/18 |
| 5,726,505 | A | * | 3/1998 | Yamada et al. | 307/127 |
| 5,914,590 | A | * | 6/1999 | Wacknov et al. | 323/282 |
| 5,939,871 | A | * | 8/1999 | Tanaka | 323/285 |
| 6,111,767 | A | | 8/2000 | Handleman | |
| 6,339,538 | B1 | * | 1/2002 | Handleman | 363/95 |
| 6,469,487 | B2 | * | 10/2002 | Ewert et al. | 62/228.4 |
| 7,233,135 | B2 | * | 6/2007 | Noma et al. | 323/285 |
| 7,453,308 | B2 | * | 11/2008 | Tihanyi | 327/309 |
| 7,817,391 | B2 | * | 10/2010 | Kimber | 361/87 |
| 2008/0094867 | A1 | | 4/2008 | Muller et al. | |
| 2011/0019444 | A1 | | 1/2011 | Dargatz et al. | |

FOREIGN PATENT DOCUMENTS

| EP | 1796238 B1 | 1/2013 |
|---|---|---|
| JP | 05284654 | 3/1992 |
| JP | 05343722 | 12/1993 |
| JP | 10289025 | 10/1998 |
| WO | 9844398 A1 | 10/1998 |
| WO | 2011017721 | 2/2011 |

OTHER PUBLICATIONS

French Search Report for FR 0753383, dated Oct. 4, 2007.

(Continued)

*Primary Examiner* — Gary L Laxton
(74) *Attorney, Agent, or Firm* — Nixon Peabody LLP (57) ABSTRACT

A voltage limiter device of an assembly of photovoltaic modules, including: (a) means (Z1) forming an electronic switch for a current of said assembly; (b) comparison means (Comp, R1, R2, C2) for comparing a voltage at the output of the limiter with a reference voltage value (Vref); and (c) means for controlling the means forming an electronic switch, depending on the result of the comparison carried out by the comparison means.

32 Claims, 10 Drawing Sheets

(56) References Cited

OTHER PUBLICATIONS

International Search Report for PCT/EP2008/051947, dated Jun. 17, 2008.
Office Action from Japanese application 2009-550275, dated Sep. 11, 2012.
Translation of abstract of Japanese publication 05284654, published Oct. 29, 1993.
Translation of abstract of Japanese publication 05343722, published Dec. 24, 1993.
Machine translation of previously cited JP 05-343722.
Machine translation of previously cited JP 05-284654.

* cited by examiner

VOLTAGE LIMITER AND PROTECTION OF A PHOTOVOLTAIC MODULE

CROSS REFERENCE TO RELATED APPLICATIONS or PRIORITY CLAIM

This application is a national phase of International Application No. PCT/EP2008/051947, entitled "VOLTAGE LIMITER AND PROTECTION FOR A PHOTOVOLTAIC MODULE", which was filed on Feb. 18, 2008, and which claims priority of French Patent Application No. 07 53383, filed Feb. 20, 2007.

TECHNICAL FIELD AND PRIOR ART

The invention relates to an electronic device of the voltage limiter type. It advantageously applies to one or more photovoltaic modules, to which it provides protection.

Presently, 3 types of photovoltaic modules are mainly known: monocrystalline, polycrystalline and amorphous types. The amorphous technology has certain advantages, notably in terms of flexibility and of the small amount of materials used.

The voltage and the current produced by photovoltaic modules depend on several parameters (period of sunshine, temperature), and they may vary significantly.

Figure 1:
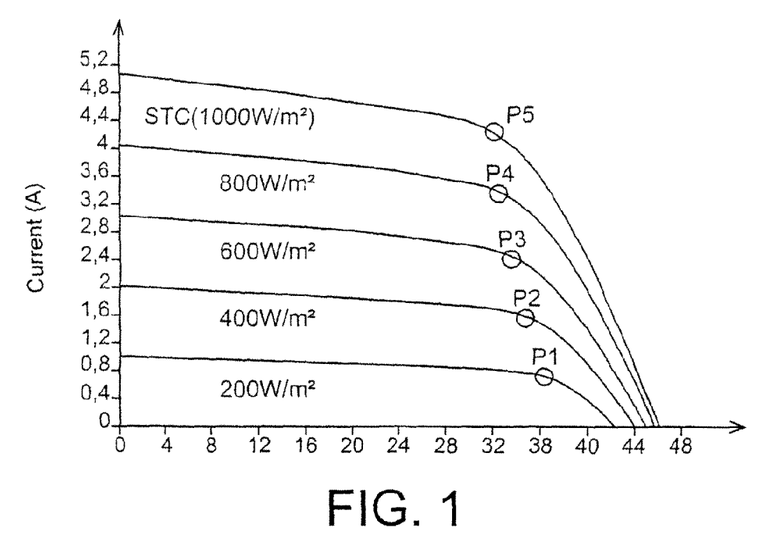
FIG. 1 illustrates currents/voltage characteristics of an amorphous photovoltaic module, versus illumination at 25° C.

FIG. 1 shows the typical characteristics of a photovoltaic module versus the received illumination (from 200 to 1,000 W/cm$^2$). The current produced by the module strongly varies depending on this illumination (proportionally in a first approximation). The voltage itself remains practically constant.

The operating points P1, P2, . . . Pn on the characteristic curves of FIG. 1 are the points where the module delivers maximum power for a given illumination. It will be noted that the voltage present at this moment is not the maximum voltage which may appear at the terminals of the module. The latter is maximum for zero current, when the module is in open circuit or when its energy is not absorbed.

This maximum voltage substantially depends on temperature: it has the value of −156 mV/° K for a monocrystalline module, −176 mV/° K for an amorphous module. It therefore increases at low temperature. This variation is much larger for amorphous modules.

In order to optimize production of energy, electronic converters connected to the photovoltaic modules impose the operating voltage of the modules so that the latter produce maximum power (this function is called: MPPT="maximum power point tracking"). The converters may however experience on their inputs, under certain conditions, a much higher voltage which corresponds to the open circuit voltage.

The converters should therefore have an operating voltage range on their input corresponding to the full possible voltage variation at the terminals of the modules under any condition. The ratio between the voltage corresponding to the maximum power and the open circuit voltage over the operating voltage range may attain: 1.4 for monocrystalline or polycrystalline modules and up to 1.6 for amorphous module.

In practice, it is desirable that the input voltage ranges of the converters be even wider in order to leave the possibility of connecting in series different numbers of modules depending on the implantation of the photovoltaic panels or on the individual voltages of the latter.

A problem posed by the known devices is the combination of converters and of rows of modules.

For technical reasons (for example: modules placed on a roof, the converters being in technical rooms), or for legal reasons (property limit), it often arises that the power converters are installed relatively far from the photovoltaic modules producing energy. In order to reduce losses by the Joule effect in the cables, the modules are combined in series in order to increase the voltage and reduce the current.

On the other hand, the sizes of the photovoltaic cells are standard and tend to increase: 4-6 inches today and even 8 inches. The current produced by a cell depends on its surface, and of course, on the illumination. As for the voltage, it depends on the material. The voltage and the power provided by a module which is an assembly of cells in series, are therefore intimately related. Further, the input power and voltage of a converter are related: the greater the power and the higher should be the acceptable voltage at the input of the converter.

The converter is itself built in order to provide maximum power and is capable of operating over a given input voltage range. This voltage range has a significant impact on the design of the converter and so finally on the cost.

Because of the significant variations of voltage with temperature and/or between operation under no load and at the maximum power point already exposed above, a single assembly of modules in series may be connected to the input of a converter and this without any actual possibility of upgrading it.

All these constraints thus considerably limit the flexibility in producing photovoltaic installations by imposing the size of the modules, their numbers and the characteristics of the converters. The architects therefore only have little latitude in the integration and size of the fields of photovoltaic modules.

Finally, an installation having been completed, it is very difficult to upgrade it by gradually adding modules (during development of a budget for example). The installation has to be complete from the start and upgrades cannot be gradual.

Therefore a problem is posed, which is to be able to combine and adapt modules more easily.

Moreover, photovoltaic systems have characteristics very different from those which are customary on electric networks.

Indeed, the modules provide a direct current (DC) as soon as they are illuminated. As photovoltaic installations are increasingly powerful, the present voltages may be of several hundred volts DC (typically between 200V and 400V). The currents also become large, typically from 10 A to 20 A per circuit.

These high voltages and currents at the outputs of the photovoltaic field are dangerous, and without any actual possibility for the user of interrupting the generator.

The connection and disconnection of modules and converters therefore have to be very often carried out during operation, with a significant risk, which is that of generating an electric arc, destructive for the electric connections, and dangerous for the user. This arc is all the more dangerous since it is generated by a direct current, without any natural passage through zero. It may under certain conditions be initiated and sustained without stopping as would an alternating current.

Usual protections (circuit breakers and fuses) do not detect these electric arcs and are therefore not effective. On the other hand, they do not properly provide protection against short circuits and overloads, because the short circuit currents provided by the photovoltaic fields are very close to the rated currents (factor of about 1.2). The circuit breakers and fuses are generally provided for letting through 1.15 times the rated current without triggering; beyond this, the opening time is all the longer since the current is close to the rated current. Finally, switches, circuit breakers and fuses have much difficulty in interrupting direct currents.

Although the connections of the photovoltaic modules with each other and with the converters, are made with special sealed connectors affording good protection to the user against direct contacts, a problem of protection of the user is then posed during connections and disconnections of the modules.

DISCUSSION OF THE INVENTION

According to the invention, an electronic limiter is inserted into the electric circuit between the photovoltaic field and the converter.

The invention first relates to a voltage limiter device of an assembly of photovoltaic modules including:
means forming an electronic switch for a current of said assembly,
comparison means for comparing a limiter output voltage with a reference voltage value,
means for controlling the means forming an electronic switch, depending on the result of the comparison carried out by the comparison means.

With such a device according to the invention, it is possible to limit the no-load voltage at the output of the modules in order to reduce the constraints on the converters and on the wirings. It thus facilitates the making of a photovoltaic installation by allowing a simpler and more changeable adaptation of the fields of modules to the converters.

Such a device may further include means for filtering the voltage measured at the output of the limiter.

A device according to the invention may further include means for smoothing an output voltage of the limiter device.

Means may be provided for detecting a rapid increase in the voltage at the output of the limiter device.

The device then ensures protection of the user by suppressing a possible electric arc appearing because of a disconnection occurring when the connection between the photovoltaic modules and the converters is operating.

According to an embodiment, the means for detecting a rapid increase in the voltage include means for calculating the time derivative of the voltage at the output of the limiter device.

According to another embodiment, the reference voltage of the comparator is set to a value above the voltage corresponding to the maximum power of the photovoltaic module, for example to a value larger than the voltage corresponding to the maximum power of the photovoltaic module, increased by a strictly positive voltage V' less than the voltage generated by an electric arc.

Means for adapting the reference voltage may be provided.

Moreover, a device according to the invention may further include short circuit detection means. It then protects against short circuits at the output of the photovoltaic module: the short circuit detection means control the opening of the means forming switches.

For example, these short circuit detection means include a current sensor positioned downstream from the switch and second comparison means for comparing a measurement from this sensor with a reference value. Means for controlling the means forming an electronic switch make it possible to open or close the switch-forming means depending on the result of the comparison carried out by the second comparison means.

First and second switch-forming means may be positioned at the input and output of the device respectively.

Energy absorption means may be positioned between the two terminals of the switch-forming means, in order to clip overvoltages generated upon opening these switch-forming means.

The invention also relates to a method for limiting voltage of a photovoltaic module, including the application of a device according to the invention, as discussed above.

The invention also relates to a device for producing energy, including:
at least one photovoltaic module,
a device according to the invention, as explained above,
means forming an electronic converter in order to impose an operating voltage to the photovoltaic module.

A device according to the invention may be placed at the output of the photovoltaic modules and upstream from the power converters and provide several functions.

Some of the functions of a device according to the invention, for example the comparison function, may be achieved in an analog way, or in a digital way with a microcontroller for example.

DETAILED DISCUSSION OF EMBODIMENTS OF THE INVENTION

Figure 2:
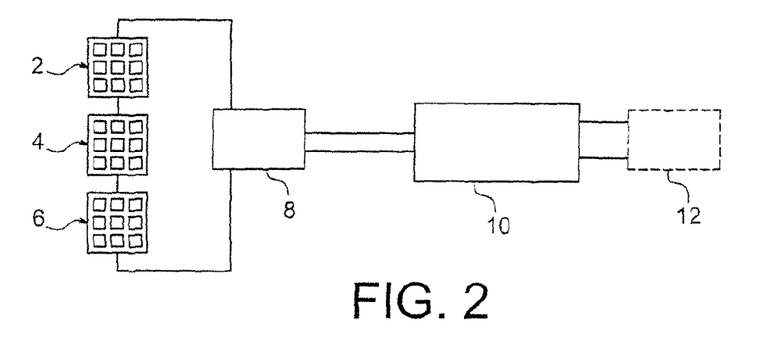
FIG. 2 illustrates a general structure of a photovoltaic installation, including a voltage limiter according to the invention.

FIG. 2 illustrates a first embodiment of the invention: an electronic limiter is inserted into the electric circuit between a photovoltaic field and a converter.

Thus, 3 photovoltaic fields 2, 4, 6, a voltage limiter 8 according to the invention, and a converter 10, connected to the electric network 12 are illustrated in this figure. The invention is not limited to three photovoltaic fields, but applies to any number of these fields. Subsequently, in the text, the whole of the voltaic fields will be designated by the single numerical reference 2.

The voltage limiter device 8 according to the invention is placed between the photovoltaic modules 2 and the power converter 10; it is preferably placed as close as possible to the photovoltaic modules, in order to provide the most effective protection against electric arcs and short circuits.

The ideal place is an installation directly at the output of the photovoltaic module.

The limiter device 8 ensures a limitation of the no-load voltage generated by the photovoltaic field and seen by the connecting cables and the input of converter 10.

Figure 3A:
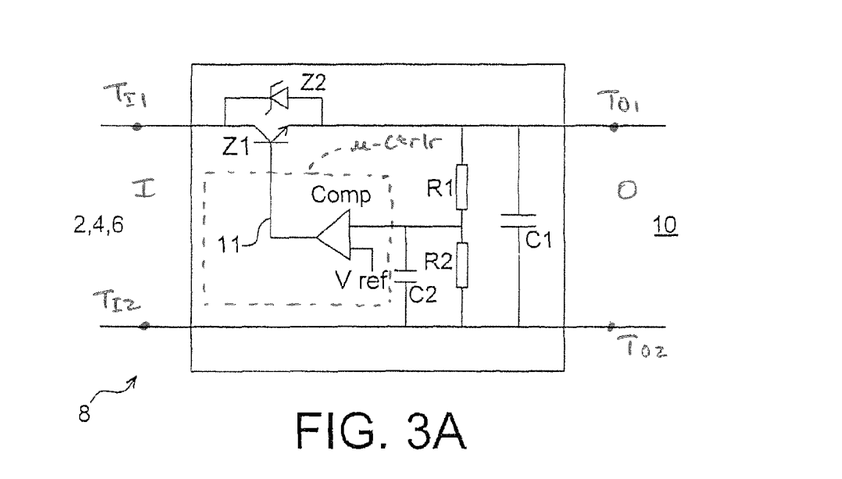
FIGS. 3A and 3B illustrate the structure of two voltage limiter devices according to the invention.

FIG. 3A shows a block diagram of a voltage limiter 8 according to the invention.

Such a device includes means forming an electronic switch Z1, with which the direct current produced by the photovoltaic field may be interrupted (for example, a bipolar transistor with an insulated gate, or IGBT, or further a MOSFET). It also includes input terminals $T_I$ and $T_{IZ}$ at an input slide I thereof, and output terminals $T_{OI}$ and $T_{OZ}$ at an output side thereof.

On the side of the converter 10, a capacitor C1 smoothes the voltage as seen by the input of this converter. A comparator Comp1 drives, via the connection means 11, the switch Z1, by comparing the voltage at the output of the voltage limiter via the divider bridge R1 and R2, with a voltage reference VRef. The device may further include a component Z2, for example a Zener diode, forming a means for absorbing energy, which clips the overvoltages generated by the wiring inductances upstream and downstream from the device upon opening the switch Z1. This clipping function in parallel on the switch Z1 may be achieved by external components or by selecting intrinsically clipping components, i.e. withstanding the avalanche mode. This is the case for many MOSFET transistors for example.

A capacitor C2 filters the voltage measured by R1/R2 in order to limit the switching frequency of the switch Z1. This function may also be fulfilled by hysteresis (produced by a feedback resistance) placed on the terminals of the comparator Comp1.

Figure 3B:
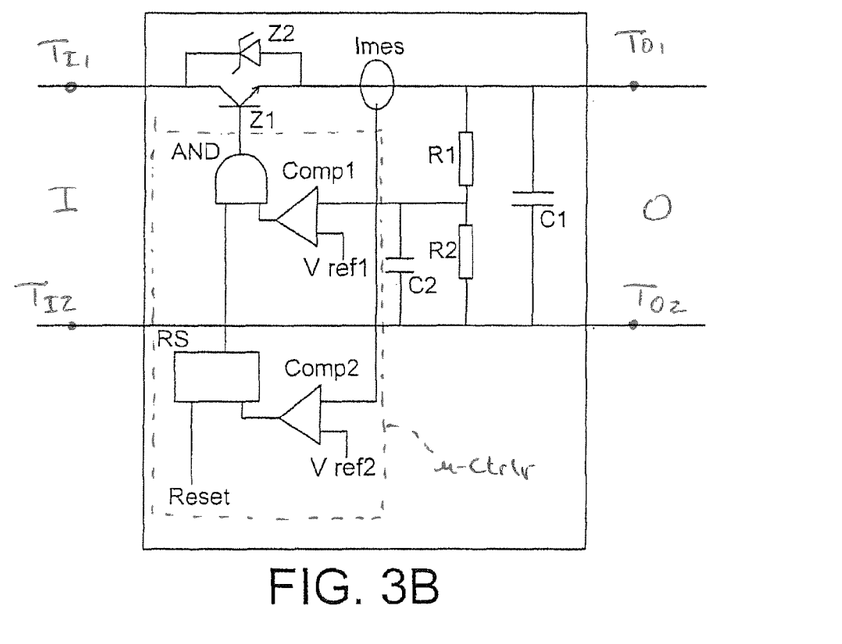

FIG. 3B shows a block diagram of another voltage limiter 8 according to the invention. It includes the same means as the diagram of FIG. 3A. These same means are designated by the same numerical references and the corresponding explanations will not be repeated.

This other limiter further includes a current sensor downstream from the switch Z1. In FIG. 3B, this sensor is designated by the reference Imes. The short circuit current of a photovoltaic module is very close to its rated current (there is only a difference of about 15-20%). Detection of the short circuit is therefore accomplished by comparing, by means of a comparator Comp2, the current from the sensor Imes with a threshold Vref2, equal to the rated current normally provided by the photovoltaic module, increased by a fraction, for example 10%, of this rated current. When the threshold is exceeded, the opening of the switch Z1 is controlled through an RS flip-flop (which stores in memory the presence of the short circuit) and through an AND gate which drives the switch Z1. The latter, an electronic switch, interrupts the direct current provided by the photovoltaic modules. In this diagram, Z1 is activated when both inputs of the AND gate are "1". The other input of this gate being the output of the comparator Comp1, an abnormal (too high) voltage or an abnormal (too high) current therefore causes opening of Z1.

The devices above are analog embodiments. The same functionalities may be achieved with digital means. For example, the comparators Comp1 and/or Comp2 are replaced in the diagrams above with a microcontroller μ-Ctrlr, into which the measured and subsequently digitized voltage values are introduced. Subsequently, reference will especially be made to the analog embodiment of FIGS. 3A and 3B, but everything may be transposed to the digital embodiment.

A device according to the invention has several modes in its operation.

According to a first mode, the converter 10 is stopped, and the photovoltaic field 2 is operating.

With the invention, it is then possible to limit the voltage generated by the photovoltaic field 2 and seen by the converter 10, to a value a little above the voltage corresponding to the maximum power point (the notion of maximum power and of maximum power points P1, P2, . . . Pn has already been explained above, in connection with FIG. 1). In this mode, the converter 10 does not absorb any current.

When the switch Z1 is initially closed, the capacitor C1 is charged through Z1, the photovoltaic cells 2 behave as current generators.

When the voltage on the terminal of C1, as measured by the divider bridge R1/R2, exceeds the value of VRef1, the comparator Comp1 toggles and opens the switch Z1.

The voltage at the terminals of C1 then decreases slowly, because of leakage currents through the converter 10 and through the other components. The comparator Comp1 having, as already explained above, slight hysteresis (or a filter such as C2), it toggles again when the voltage at the terminals of C1 reaches the low threshold, thereby closing the switch Z1 in the case of FIG. 3A. In the case of FIG. 3B, a second condition, that of a normal current (absence of any short circuit), is added to the first condition in order to close Z1.

The cycle thus regularly starts again with a frequency depending on the value of the components, on the leakage currents, on the hysteresis of the comparator, etc. The voltage at the terminals of C1 is thus controlled to a value set by the reference of the comparator. This value is set so as to be a little above the voltage corresponding to the maximum power of the photovoltaic field 2, and preferably much less than the no-load voltage generated by this field.

For example, for a photovoltaic field of amorphous cells, the no-load voltage being 400V, the voltage at the maximum power point is 250V (about: 400V/1.6). The device then limits the voltage to 300V. The power converter 10 therefore sees a reduced voltage of 300V instead of 400 V at its terminals.

According to a second embodiment, the converter 10 is in operation, as well as the photovoltaic field 2, 4, 6.

When the converter is activated, it consumes a substantial current. The voltage at the terminals of C1 decreases very rapidly and passes under the threshold of the reference of the comparator Comp1, and the latter closes the switch Z1. The converter 10 imposes a voltage corresponding to the maximum power being provided by the photovoltaic field. The voltage measured by R1/R2 therefore does not pass again above the reference value Vref1 since the latter was adjusted for a voltage at the terminals of C1 slightly above the optimum power voltage of the field. The switch Z1 therefore remains permanently closed, thereby powering the converter 10.

In a third operating mode, there is an opening of the circuit between the limiter device 8 and the converter 10.

This opening may result from the opening, either accidental or not, of a connector or of an electric connection between the means 8 and the converter 10 (at the input of the converter 10 for example). There is then an instantaneous occurrence of an electric arc between an anode A and a cathode C.

Figure 8:
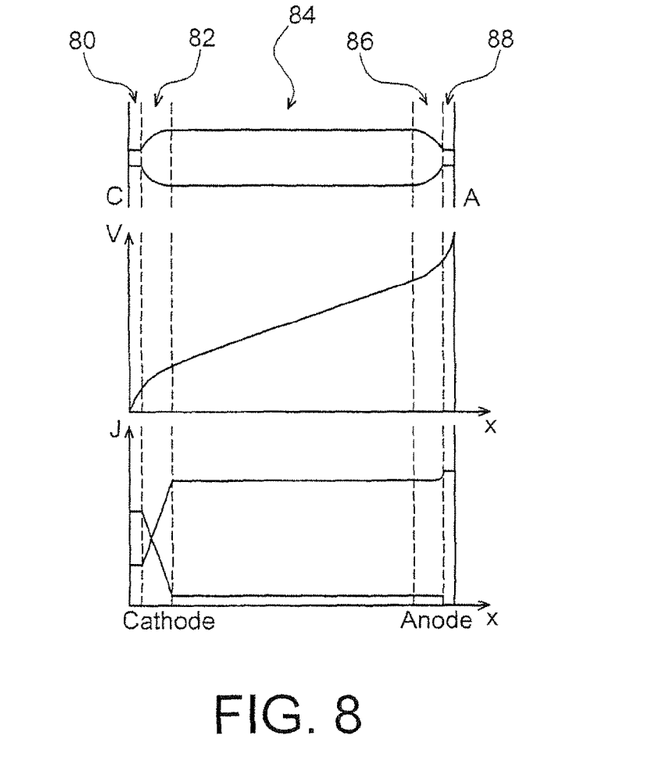
FIG. 8 illustrates the structure of an established electric arc.

FIG. 8 shows the simplified structure of an electric arc.

Schematically, the latter consists of several areas between an anode A and a cathode C: two areas 80, 82 of space charges, close to the electrodes, each of which is of a small thickness (a few μm), relatively cold (temperature <1,000° K), and an intermediate area 84, which is the core of the arc and which consists of very hot plasma (temperature>a few thousands of ° K). The electrode/air transition areas 80, 82 generate a voltage drop practically independent of the current, of about 10V to 20V. The intermediate area 84 behaves like a resistor generating a voltage drop proportional to the current.

When the current is interrupted, the area 84 remains hot for a very long time (cooling through convection and radiation in the ambient medium i.e. air, a heat insulator) and therefore remains highly conducting. On the other hand the charges in the areas 80 and 88 recombine very rapidly when the current is interrupted, and again become very rapidly insulating (within a few μs after stopping the current).

An electric arc therefore instantaneously (within a few µs) upon its occurrence generates a voltage drop of at least 10V to 20V. Capacitors, placed at the input of the converter, have a high value relatively to C1. The voltage at their terminals therefore only varies much more slowly than the voltage at the terminals of C1.

In order to protect the user from the electric arc, this rapid increase in the voltage at the terminals of C1 (this is for example a variation of about 20V within a few ms) is detected. It should be noted that the normal change in voltage due to searching for the optimum operating point of the photovoltaic module by the converter is much slower (among other things because of the large capacitances present at the input of the converter). This rapid voltage change is therefore actually related to the occurrence of the electric arc.

The circuit detects this change in voltage by adjusting the reference Vref1 of the comparator Comp1 to a value equal to the voltage corresponding to the maximum power of the photovoltaic module+a voltage V', 0V<V'<the voltage generated by the electric arc (which is for example of the order of 10V). This can be performed by microcontroller µ-Ctrlr for instance.

It is also possible to detect the sudden change of this voltage by calculating its derivative, for example with microcontroller µ-Ctrlr mentioned above in connection with FIGS. 3A and 3B (and which then replaces the comparator Comp1 and/or Comp2), and by comparing this value with a predefined threshold. This voltage is the one present at the terminals of C1 when the system is in the second operating mode as described earlier. The system may therefore operate by measuring this voltage and by automatically adapting the voltage reference (learning). Indeed, the normal changes of this voltage are slow: a few volts per second (searching for the optimum operating point by the MPPT function of the converter (a function already mentioned above: <<maximum power point tracking>>), a change in voltage of the photovoltaic field due to changes in temperature). Sliding filtering of this voltage over a certain duration (for example 10 minutes) allows the voltage reference (the latter changing very slowly over time) to be determined. A sudden change relatively to this average is abnormal and corresponds to the occurrence of an electric arc. These functions may be achieved digitally with a microcontroller, such as the one already mentioned above. They may also be achieved in an analog way.

Once the change in voltage is detected, Z1 is opened in order to interrupt the current and thus suppress the nascent electric arc. This detection and this opening being very rapid, the arc is of a very small amplitude and therefore safe.

A device according to the invention therefore also ensures a function for interrupting the current, without any electric arc, upon voluntary or accidental disconnection of the connection between the photovoltaic modules 2 and the converter 10, in operation.

As explained above, this interruption function without any electric arc of the current upon disconnection preferably uses a particular adjustment of the device.

In a fourth operating mode, short circuits are detected.

A protection against short circuits is achieved by the device of FIG. 3B, already described above, Imes. Detection of the short circuit is accomplished by comparing, by means of the comparator Comp2, the current from the sensor with a threshold equal to the rated current normally provided by the photovoltaic module, increased by a fraction, for example 10%, of this rated current. When the threshold is exceeded, the opening of the switch Z1 is controlled through the RS flip-flop and the AND gate. The electronic switch Z1 then interrupts the direct current provided by the photovoltaic modules.

Effective protection against short circuits is therefore achieved by electronic detection of excess intensities, by measurement of current and comparison of this measurement with a reference value.

Various more specific embodiments of the device according to the invention will be discussed in connection with FIGS. 4 to 11.

These embodiments apply the principles discussed earlier. The means of FIG. 3B are not illustrated in these figures but they may be incorporated thereto. In FIGS. 4 to 11, the means 32, 34 respectively fulfill the functions of comparator (Comp1 of FIG. 3) and of driver of the switch Z1 (insulated control of the gate for an IGBT or a MOSFET under a voltage of 10V relative to its source or its emitter). This function exists entirely integrated under the name of IGBT or MOSFET driver; it is also possible to produce it with a photocoupler and 2 transistors mounted in a push-pull configuration.

The other portions are modeled with real components. Protective means against short circuits such as the means Imes, Comp2, RS, AND of FIG. 3B are not illustrated. But these means may be added without modifying the presented models.

Simulations of these diagrams were carried out with <<Pspice>> (this is a commercial software package intended for simulating electronic diagrams. It is marketed by Cadence) in order to validate them. Each diagram is therefore shown with its simulation.

Figure 4:
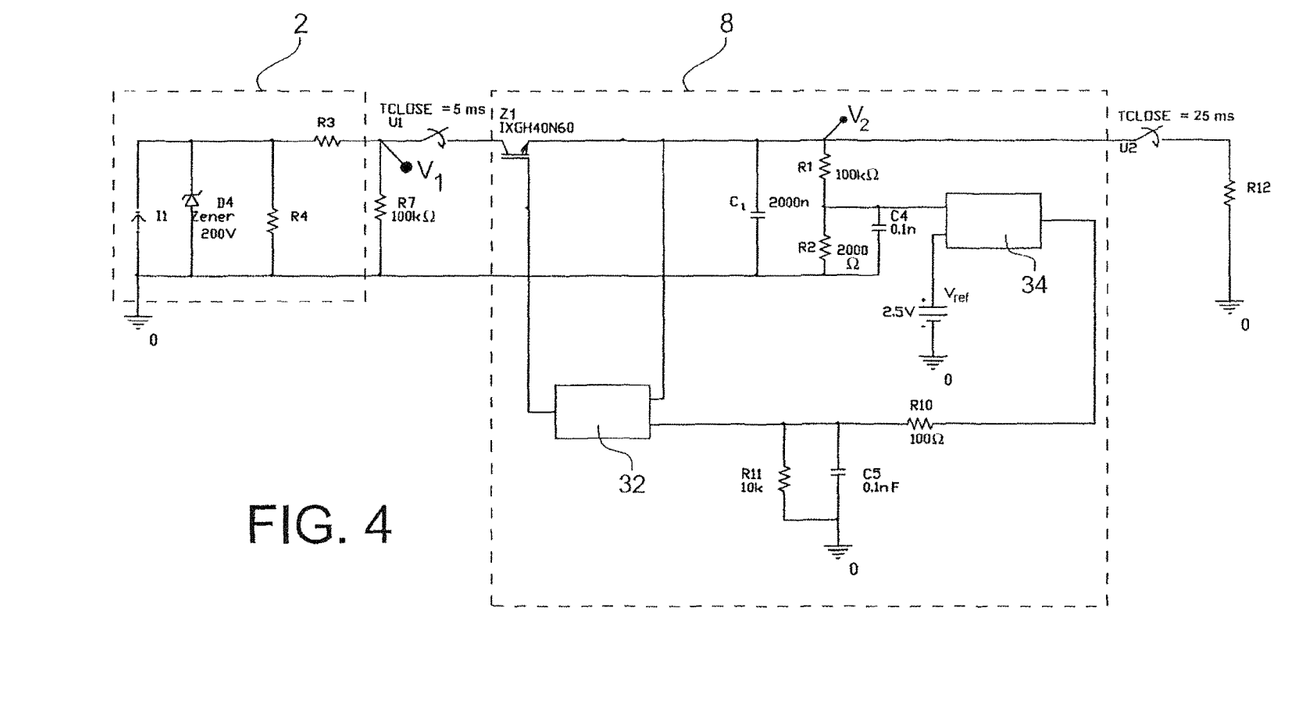
FIGS. 4, 6 and 9 are various detailed illustrations of a device according to the invention.

A first detailed embodiment is illustrated in FIG. 4, in which a photovoltaic module 2, for example with a no-load voltage of 200V and a current of 4 A when short circuited, is modeled by the components I1 (current source), the Zener diode D4, the resistor R4 (for example with the value of 100,000 Ohms), all three positioned in parallel, a resistor R3 (for example with the value of 0.001Ω) being positioned at the module input. The numerical values of components, indicated in this figure or in the corresponding text, are given only as a pure and non-limiting indication.

A resistor R7 allows measurement of what emerges from the photovoltaic module 2.

The components Z1, C1, R1, R2, C2, Vref, are those already mentioned above in connection with FIGS. 3A and 3B, and with the same functions. R10, C5 and R11 form a low-pass filter with which possible parasitic oscillations may be suppressed from the comparator Comp1. These means, combined with the means 32, 34, allow modelling of a voltage limiter according to the invention.

The resistor R12 (with a value of 20Ω for example), positioned at the input of the voltage limiter, is a load which allows simulation of a converter such as the converter 10 (FIG. 2) in operation.

Switches U1 and U2 are respectively positioned between the photovoltaic module 2 and the limiter 8, and between the latter and the converter 10. Values of opening times (TOPEN) or closing times (TCLOSE) of these switches are indicated in this figure, as a non-limiting example. The same applies to the other indicated values for these switches or for other components, whether in FIG. 4 or in the other figures (for example: U3 in FIG. 9).

Figure 5:
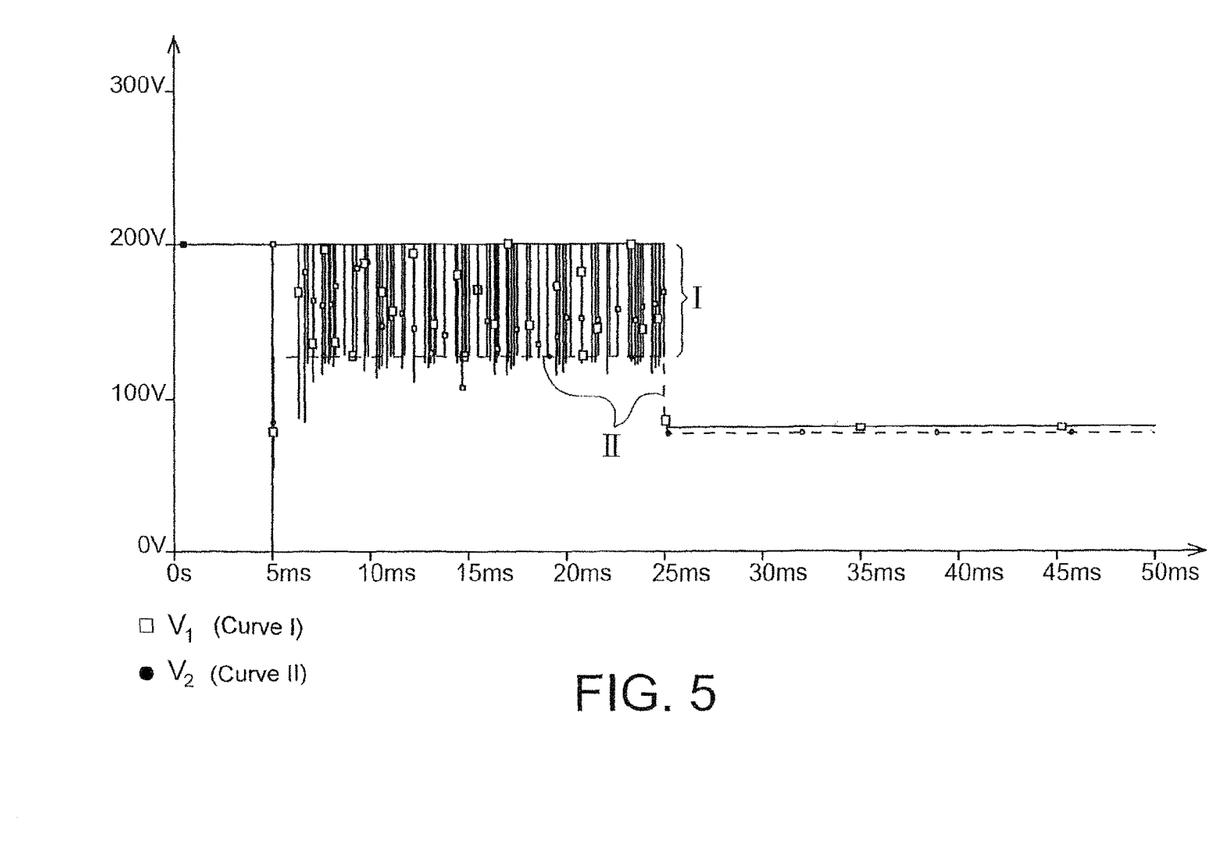
FIGS. 5, 7A-7C, 10A, 10B, 11 illustrate various electrical quantities measured in embodiments of devices according to the invention.

The results of a simulation of this diagram are illustrated in FIG. 5. In this figure, the curves I and II respectively illustrate:
curve I: measurement of the voltage V1 at the terminals of R7 (at the output of the module),
curve II: measurement of the voltage V2 at the terminals of R1 (at the output of the servocontrol).

The simulation is divided into 3 time phases, activated by the 2 switches U1 and U2:

A/ From 0 ms to 5 ms: the switch U1 is opened, the servo-control and the converter 10 are off-line. V1 gives the measurement of the no-load voltage of the photovoltaic module, i.e. 200V.

On the simulation, it appears that the voltage at the terminals of the module is 200V and that the voltage V2 at the output of the servocontrol (curve II) is 0V.

B/ From 5 ms to 25 ms: the switch U1 is closed and the switch U2 is opened. The servocontrol is active and the converter 10 is off-line.

On the simulation, it appears (curve I) that the voltage V1 at the terminals of the photovoltaic module is 200V practically all the time (no-load voltage) except when the servocontrol picks up a little energy. As for the voltage V2 at the output of the servocontrol (curve II), it is controlled to 130V (maximum voltage seen by the converter).

C/ From 25 ms to the end of the simulation, the switch U1 is closed and the switch U2 is closed. The converter 10 is active and picks up power (4A for a 20 ohm resistor, i.e. an imposed voltage of 80V).

The servocontrol no longer controls and the IGBT Z1 is then permanently closed in order to allow transfer of power towards the converter 10 with minimum losses.

On the simulation, it appears that the voltage V1 at the terminals of the photovoltaic module (curve I) and the voltage V2 at the output of the servocontrol (curve II) are practically identical to within the voltage drop on the IGBT, and equal to the voltage imposed by the converter 10.

The diagram of FIG. 4 does not take into account inductances of wirings which will generate overvoltages upon blocking the IGBT Z1.

Figure 6:
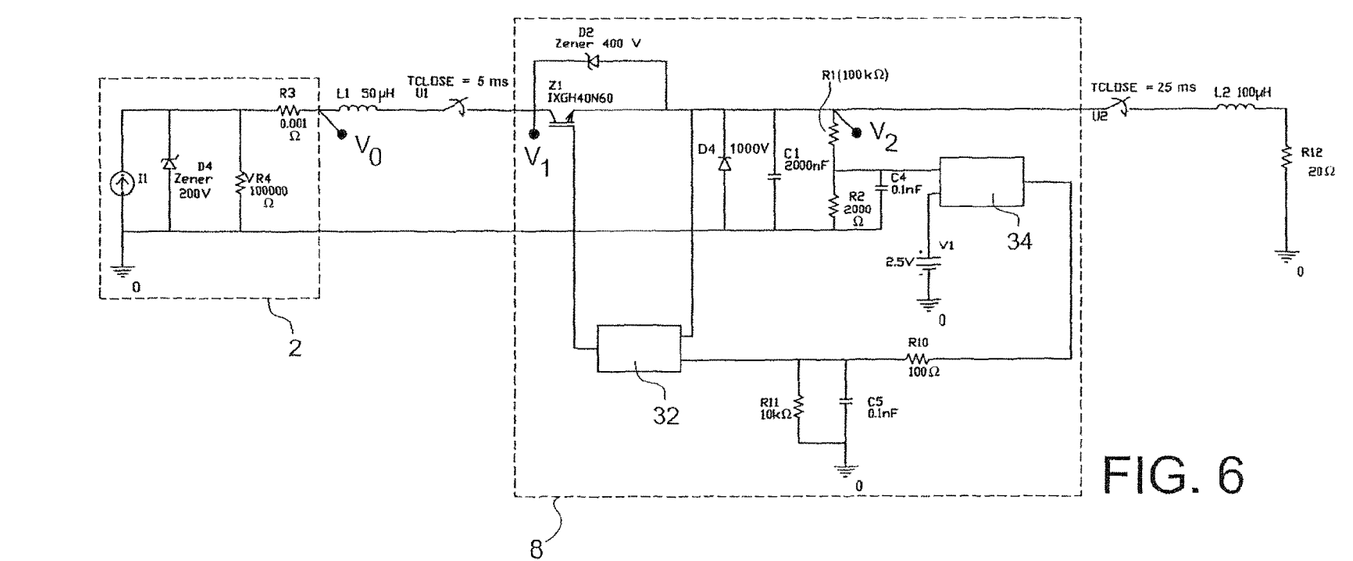

In order to take these inductances into account, a modified diagram may be the one illustrated in FIG. 6. This is the one of FIG. 4, to which are added:

an inductor L1, in order to take into account the wiring inductances between the photovoltaic modules 2 and the device 8 for limiting the (no-load) voltage, an inductor L2 in order to take into account the inductances downstream from the voltage limiting device 8, right up to the converter 10. The line inductance of the cable taken as an example, is 1 µH/m. Therefore 25 m of roundtrip cable upstream from the device and 50 m of roundtrip cable downstream from the latter are simulated.

The Zener diode D2 positioned in parallel to the component Z1, absorbs the overvoltages generated by the inductor L1 at the terminals of the switch U1, during its opening. The yield of the converter 10 is not very important but it is therefore conceivable to dissipate this energy.

The diode D4 (with a voltage equal to about 1,000V for example), positioned in parallel with the capacitor C1, is used as a free wheel for the inductor L2 when U2 is closed.

Figure 7A:
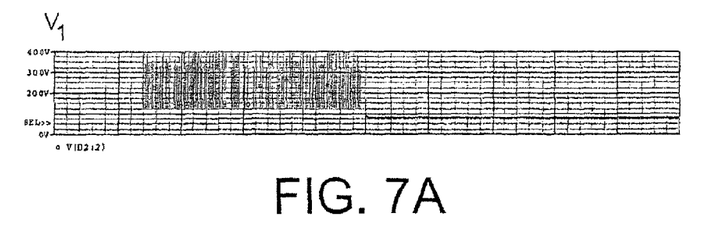
Figure 7B:
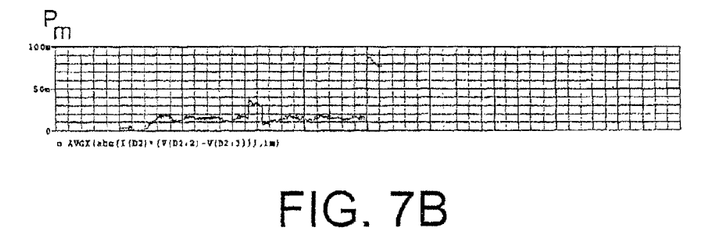
Figure 7C:
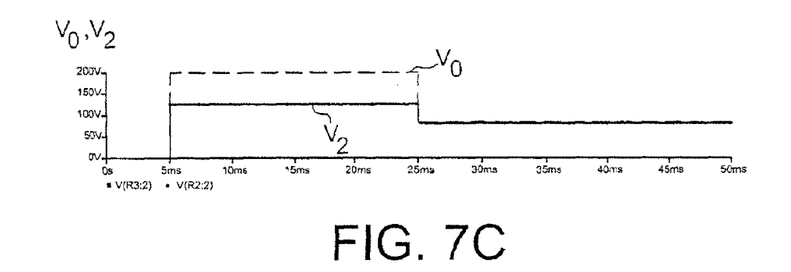

The results of the simulation of this diagram are illustrated in FIGS. 7A-7C.

The phases of the simulation are the same as for the first diagram:

A/ from 0 to 5 ms: the photovoltaic module is in a no-load condition,

B/ from 5 ms to 25 ms: the photovoltaic module and the limitation device 8 are both operating, C/ from 25 ms to the end: the photovoltaic module and the limitation device 8 are operating and the converter 10 is being loaded.

The curve of FIG. 7A illustrates the voltage V1 upstream from the limitation device 8; it shows the overvoltages, generated by the upstream inductor L1 and absorbed by the Zener diode D2.

The curve of FIG. 7B illustrates the average power Pm dissipated by the diode D2 on the terminals of IGBT Z1. This power remains reasonable and is easy to dissipate in a component (5 mW for example).

The curve of FIG. 7C illustrates:

the voltage V2 at the output of the limitation device 8, on the side of the converter 10, the voltage V0, at the output of the photovoltaic modules 2.

Figure 9:
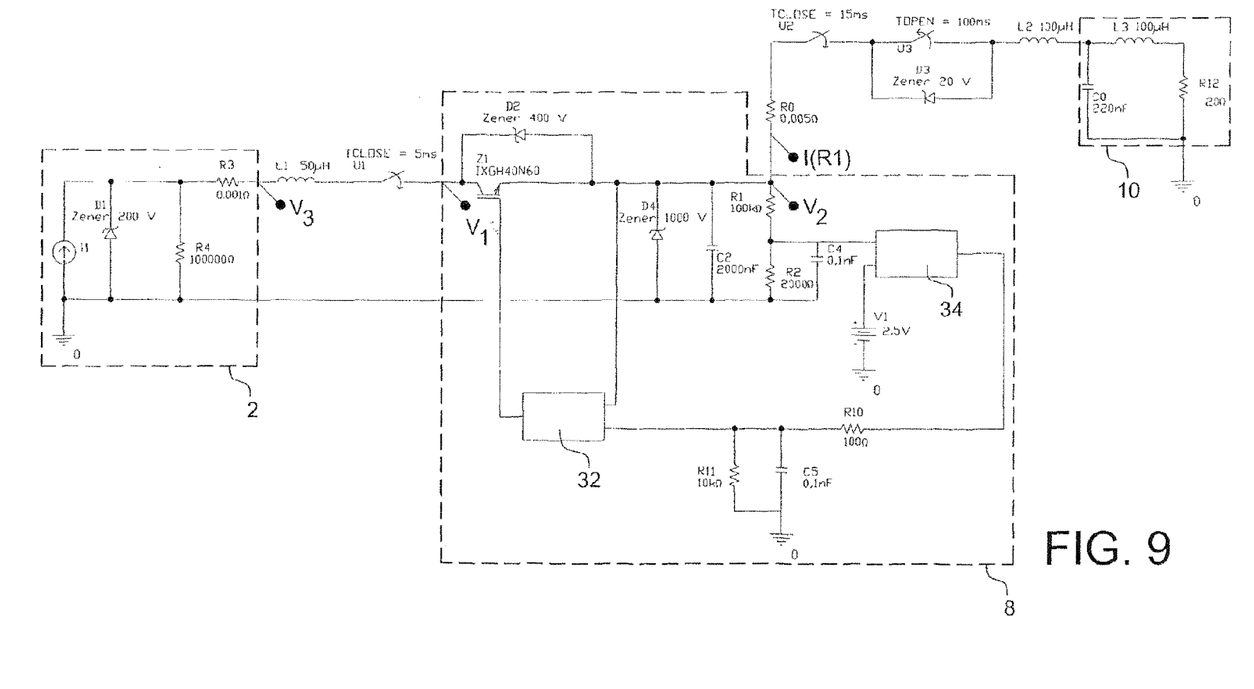

A third detailed embodiment is illustrated in FIG. 9.

A simplified model of the voltage raiser converter 10 is added to the diagram of FIG. 6: a capacitor C0 (for example: 220 µF), an inductor L3 (for example: 100 µH) and the resistor R12. The inductor L3 of the resistance R12 is mounted in series, the capacitor C0 being positioned in parallel at the terminals of this assembly.

The inductor L2 represents the inductance of the cables between the limiter 8 and the converter 10 while the resistor L0 represents the resistance of this cable (by taking it into account, it is possible to reduce oscillations of the LC circuits).

A switch U3 and a Zener diode D3 mounted in parallel are a simplified model of an electric arc and of the voltage which it generates when it is powered by a current (a voltage of about 20V). U3 is opened after 100 ms in order to simulate opening of a connector under load with occurrence of an electric arc.

The structure of an electric arc was already explained above in connection with FIG. 8.

By the simulation, the arc is modelled by a voltage of 20V (that of the Zener diode D3) and it is checked whether it is possible to detect this voltage (and the occurrence of an electric arc) at the voltage limiter 8, or at a conductor placed between the limiter 8 and the converter 10 and opened by the user under load.

Figure 10A:
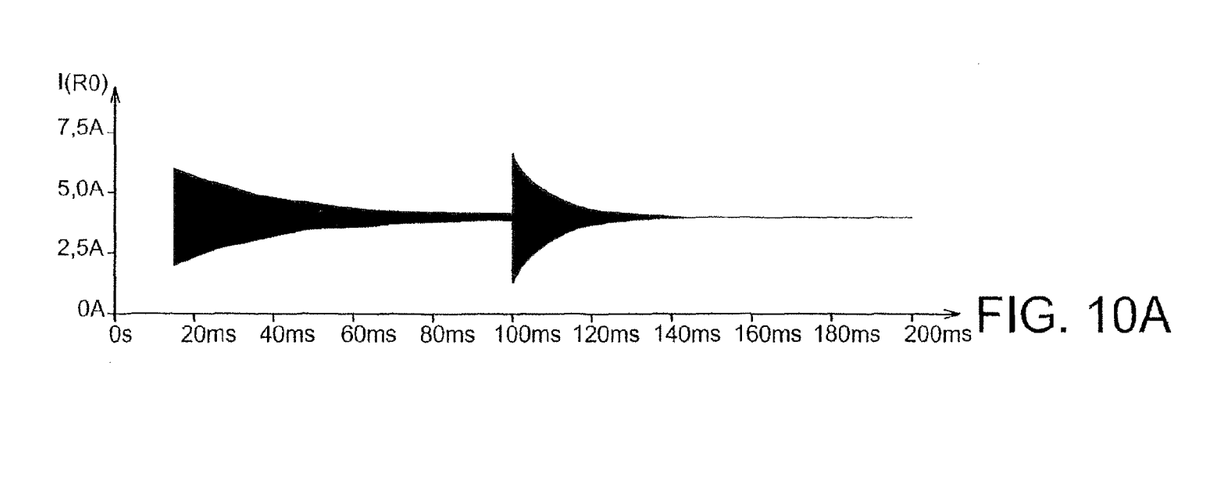
Figure 10B:
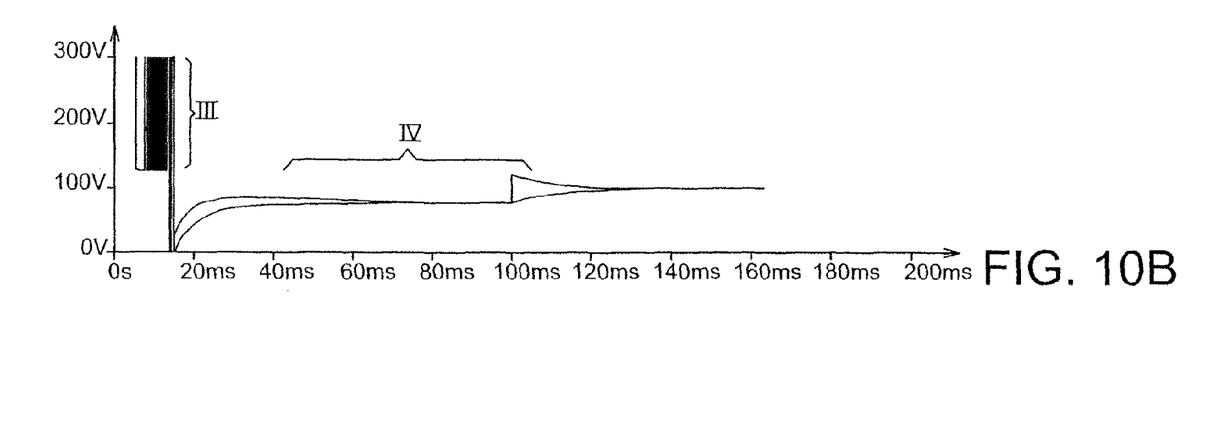
Figure 11:
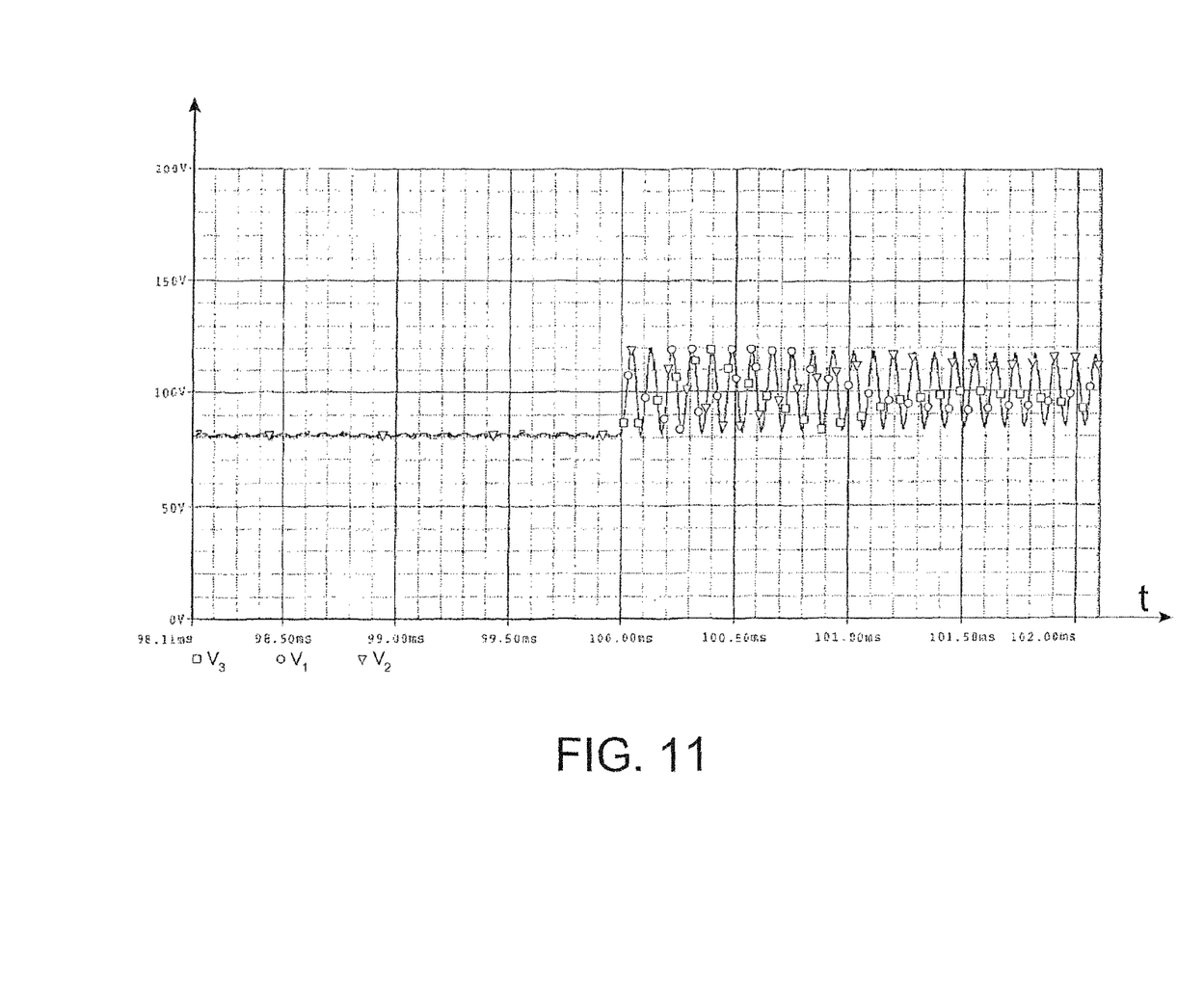

The curves of FIGS. 10A and 10B show the result of simulations of this $3^{rd}$ embodiment. In these figures:

I(R0) represents the current downstream from the device. This current is highly oscillatory (whence the black schematic illustration), which is due to the L2C1 circuit of the simulation, the curves of FIG. 10B illustrate voltage measurements:

a) curve III: voltage V1 (here also very oscillatory) upstream from the device; V1 also extends beyond about 15 ms, within the limits of the IV curves, b) curve IV: voltage V2 downstream from the device, at the terminals of the divider bridge R1, R2 used for measuring voltage. The simulation also shows portions or oscillations before t=15 ms.

A change in voltage during the opening of U3 corresponding to the opening of the connector under load is clearly seen. Enlargement of FIG. 11 clearly shows this transition, around t=100 ms.

These simulations show that the opening of an electric connector under load downstream from a device 8 according to the invention is detectable from the voltage measurement.

The invention claimed is:

1. A voltage limiter device operable to limit voltage delivered by an assembly of photovoltaic modules through an output of the voltage limiter device, the voltage limiter device having a pair of input terminals couplable to the assembly of photovoltaic modules and having a pair of output terminals at the output, the voltage limiter device comprising:

an electronic switch operable to interrupt a current delivered by said assembly of photovoltaic modules, the electronic switch being disposed between a first input terminal and a first output terminal of the voltage limiter device;

a first comparator operable to compare a voltage at the output of the voltage limiter device with a reference voltage value that is set to a value above a voltage corresponding to a maximum power of the assembly of photovoltaic modules, increased by a strictly positive voltage V' less than a voltage generated by an electric arc; and a controller operable to open said switch to thereby prevent passage of current from the assembly of photovoltaic modules to the output by way of the first input and first output terminals, and to close said switch to thereby permit passage of current from the assembly of photovoltaic modules to the output by way of the first input and first output terminals, depending on a result of a comparison carried out by the first comparator, wherein during operation, the input voltage of the voltage limiter device is approximately equal to the output voltage of the voltage limiter device when the switch is closed and the voltage compared by the comparator to the reference voltage corresponds to a voltage at the output of the switch.

2. The device according to claim 1, further including a filter operable to filter voltage measured at the output of said voltage limiter device.

3. The device according to claim 1, further including means for smoothing voltage at the output of the voltage limiter device.

4. The device according to claim 1, further including a capacitor at the output of the voltage limiter device.

5. The device according to claim 1, further including means for detecting a rapid increase in the voltage at the output of the voltage limiter device and for comparing this increase with a threshold value.

6. The device according to claim 5, including means for calculating a time derivative of the voltage at the output of the voltage limiter device.

7. The device according to claim 1, including a micro controller to calculate a time derivative of the voltage at the output of the voltage limiter device.

8. The device according to claim 1, wherein the reference voltage of the comparator is set to a value above a voltage corresponding to maximum power of the assembly of photovoltaic modules.

9. The device according to claim 8, the reference voltage of the comparator being set to a value above the voltage corresponding to the maximum power of the assembly of photovoltaic modules, increased by a strictly positive voltage V' less than a voltage generated by an electric arc.

10. The device according to claim 1, further including means for adapting the reference voltage value (Vref1).

11. The device according to claim 1, further including short circuit detection means, downstream from the switch.

12. The device according to claim 11, said short circuit detection means including a current sensor positioned downstream from the switch and a second comparator comparing a measurement from this sensor with a reference value, to detect a short circuit downstream from the switch.

13. The device according to claim 1, further including a current sensor positioned downstream from the switch and a second comparator comparing a measurement from this sensor with a reference value, to detect a short circuit downstream from the switch.

14. The device according to claim 13, further including a controller of said electronic switch, depending on the result of the comparison carried out by the second comparator.

15. The device according to claim 1, wherein said electronic switch includes two terminals, the voltage limiter device further including means for absorbing energy between the two terminals of said electronic switch in order to clip overvoltages generated upon opening said switch.

16. The device according to claim 1, further including a Zener diode absorbing energy between the two terminals of said electronic switch in order to clip overvoltages generated upon opening said switch.

17. An energy producing device, including:
at least one photovoltaic module,
the device according to claim 1,
an electronic converter, in order to impose an operating voltage to the at least one photovoltaic module.

18. The energy producing device of claim 17, wherein the reference voltage value is less than a no-load voltage generated by the at least one photovoltaic module.

19. The energy producing device of claim 17, wherein, when the converter is inactive, the at least one photovoltaic module delivers through the limiter device a voltage which allows the capacitive input of the electronic converter to be loaded up to a voltage substantially equal to the reference voltage, and wherein, when the electronic converter is active, the at least one photovoltaic module delivers through the limiter device a voltage of the at least one photovoltaic module, substantially equal to an input voltage of the electronic converter.

20. The device of claim 1, wherein the switch is open when the result of the comparison is that the voltage at the output of the voltage limiter is above the reference voltage value, and is closed when the result of the of comparison is that the voltage at the output of the voltage limiter is below the reference voltage value.

21. The device of claim 1, wherein the reference voltage is configured to vary adaptively as a function of a voltage at the output of the voltage limiter.

22. A voltage limiter device operable to limit voltage delivered by an assembly of photovoltaic modules through an output of the voltage limiter device, the voltage limiter device having a pair of input terminals couplable to the assembly of photovoltaic modules and having a pair of output terminals at the output, the voltage limiter device comprising:

an electronic switch operable to interrupt a current delivered by said assembly of photovoltaic modules, the electronic switch being disposed between a first input terminal and a first output terminal of the voltage limiter device;

a microcontroller operable to compare a voltage at the output of the voltage limiter device with a reference voltage value that is set to a value above a voltage corresponding to a maximum power of the assembly of photovoltaic modules, increased by a strictly positive voltage V' less than a voltage generated by an electric arc; and a controller operable to open said switch to thereby prevent passage of current from the assembly of photovoltaic modules to the output by way of the first input and first output terminals, and to close said switch to thereby permit passage of current from the assembly of photovoltaic modules to the output by way of the first input and first output terminals, depending on a result of a comparison carried out by the microcontroller, wherein during operation the input voltage of the voltage limiter device is approximately equal to the output voltage of the voltage limiter device when the switch is closed and the voltage compared by the microcontroller to the reference voltage corresponds to a voltage at the output of the switch.

23. The device according to claim 22, wherein the microcontroller detects a rapid increase in the voltage at the output of the voltage limiter device and compares said increase with a threshold value.

24. The device according to claim 22, wherein said microcontroller is operable to calculate a time derivative of said voltage at the output of the voltage limiter device.

25. The device according to claim 22, wherein the reference voltage is set to a value above a voltage corresponding to a maximum power of the assembly of photovoltaic modules.

26. The device according to claim 25, the reference voltage being set to a value above a voltage corresponding to a maximum power of the assembly of photovoltaic modules, increased by a strictly positive voltage V' less than a voltage generated by an electric arc.

27. The device according to claim 22, further including a current sensor positioned downstream from the switch and a comparator comparing a measurement from said current sensor with a reference value, to detect a short circuit downstream from the switch.

28. The device according to claim 27, further including a controller of said electronic switch, depending on the result of the comparison carried out by the second comparator.

29. An energy producing device, including:
at least one photovoltaic module,
the device according to claim 22,
an electronic converter, in order to impose an operating voltage to the at least one photovoltaic module.

30. The energy producing device of claim 29, wherein the reference voltage value is less than a no-load voltage generated by the at least one photovoltaic module.

31. The energy producing device of claim 29, wherein, when the converter is inactive, the at least one photovoltaic module delivers through the limiter device a voltage which allows the capacitive input of the electronic converter to be loaded up to a voltage substantially equal to the reference voltage, and wherein, when the electronic converter is active, the at least one photovoltaic module delivers through the limiter device a voltage of the at least one photovoltaic module, substantially equal to an input voltage of the electronic converter.

32. The device of claim 22, wherein the switch is open when the result of the comparison is that the voltage at the output of the voltage limiter is above the reference voltage value, and is closed when the result of the of comparison is that the voltage at the output of the voltage limiter is below the reference voltage value.

* * * * *

UNITED STATES PATENT AND TRADEMARK OFFICE
CERTIFICATE OF CORRECTION

PATENT NO. : 8,570,017 B2
APPLICATION NO. : 12/528054
DATED : October 29, 2013
INVENTOR(S) : Perichon et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 880 days.

Signed and Sealed this
Twenty-second Day of September, 2015

Michelle K. Lee
*Director of the United States Patent and Trademark Office*